United States Patent
Higuchi et al.

(10) Patent No.: US 7,902,919 B2
(45) Date of Patent: Mar. 8, 2011

(54) CURRENT AMPLIFYING ELEMENT AND CURRENT AMPLIFICATION METHOD

(75) Inventors: Katsuhiko Higuchi, Hiroshima (JP); Masahiko Higuchi, Nagano (JP)

(73) Assignees: Hiroshima University, Hiroshima (JP); Shinshu University, Nagano (JP)

( * ) Notice: Subject to any disclaimer, the term of this patent is extended or adjusted under 35 U.S.C. 154(b) by 44 days.

(21) Appl. No.: 12/376,113

(22) PCT Filed: Aug. 2, 2007

(86) PCT No.: PCT/JP2007/065141
§ 371 (c)(1),
(2), (4) Date: Feb. 2, 2009

(87) PCT Pub. No.: WO2008/016103
PCT Pub. Date: Feb. 7, 2008

(65) Prior Publication Data
US 2010/0001791 A1    Jan. 7, 2010

(30) Foreign Application Priority Data
Aug. 3, 2006   (JP) .................................. 2006-212395

(51) Int. Cl.
*H03F 15/00*   (2006.01)
(52) U.S. Cl. ............................................. 330/6
(58) Field of Classification Search ................ 330/6, 47, 330/60, 63
See application file for complete search history.

(56) References Cited
U.S. PATENT DOCUMENTS
3,613,021 A * 10/1971 Scheidt ............................. 330/6

FOREIGN PATENT DOCUMENTS

| JP | 50-120785 A | 9/1975 |
|---|---|---|
| JP | 63-142876 A | 6/1988 |
| JP | 5-226635 A | 9/1993 |
| JP | 2002-170937 A | 6/2002 |
| JP | 2004-235568 A | 8/2004 |

OTHER PUBLICATIONS

Keisuke Shinohara et al., "Extremely High-Speed Lattice-Matched InGaAs/InAlAs High Electron Mobility Transistors with 472 GHz Cutoff Frequency", Jpn. J. Appl. Phys. vol. 41 (2002), pp. L437-L439.

Takatomo Enoki et al., "Prospects of InP-Based IC Technologies for 100-GBIT/S-Class Lightwave Communications Systems", International Journal of High Speed Electronics and Systems, vol. 11, No. 1 (2001), pp. 137-158.

Mark J.W. Rodwell et al., "Submicron Scaling of HBTs", IEEE Transactions on Electron Devices, vol. 48, No. 11, Nov. 2001, pp. 2606-2624.

International Search Report for PCT/JP2007/065141 mailed Oct. 16, 2007.

* cited by examiner

*Primary Examiner* — Robert Pascal
*Assistant Examiner* — Khiem D Nguyen
(74) *Attorney, Agent, or Firm* — Roberts Mlotkowski Safran & Cole P.C.

(57) ABSTRACT

A current amplifying element that operates at a higher speed than conventional semiconductor devices is provided. An input current flows through an input current path 60 in a direction X, and a magnetic field generated from a magnet 90 is applied in a direction Z which is perpendicular to the direction X. An output current path 70 is formed under the input current path 60 with an insulator 80 interposed therebetween. Since the direction in which an output current flows is perpendicular to both the input current and the magnetic field, the current is amplified by the galvanomagnetic effects produced by the input current and the magnetic field.

3 Claims, 4 Drawing Sheets

CURRENT AMPLIFYING ELEMENT AND CURRENT AMPLIFICATION METHOD

TECHNICAL FIELD

The present invention relates to a current amplifying element and a current amplification method, and more particularly, to a current amplifying element including a magnetic generator.

BACKGROUND ART

In recent years, the demand for high-capacity high-speed data transmission and reception has been increasing, and various studies are being undertaken to transmit and receive larger volumes of data at higher speeds. For example, to amalgamate electronics, which uses electronic devices such as field effect transistors, and photonics, which uses photonic devices such as light emitting diodes, signal processing techniques in the THz band which is in a higher frequency range than the millimeter wave band are being studied vigorously. To realize such techniques, electronic devices capable of operating in the THz band are indispensable.

Of the electronic devices, transistors which perform amplification, e.g., MOS transistors, have a gate insulator and thus have input impedance. When the operating frequency is increased, this input impedance causes an input's output to be delayed, and at frequencies higher than a certain level, the output waveform is distorted or amplification cannot be performed. Currently, development of electronic devices is being done under a strategy in which in order to increase the frequency (i.e., the cutoff frequency) at which current gain is 1, electronic circuits are miniaturized and materials having high electron mobility are used.

In Non-Patent Document 1, a transistor fabricated under this strategy is reported. This transistor is made of InGaAs, the gate length thereof is 25 nm, and, as a result, the cutoff frequency thereof is 0.562 THz.

Patent Document 1 also discloses a field effect transistor which includes a gate and a channel layer of two-dimensional electrons, and in which a high cutoff frequency and a high gain are achieved at a high frequency by applying a magnetic filed in a direction perpendicular to the direction in which the electrons flowing in the two-dimensional electron channel layer move. Patent Document 1 shows that when the gate length was 0.15 µm, a cutoff frequency of 1.08 THz was achieved.

Patent Document 1: Japanese Laid-Open Publication No. 2004-235568
Patent Document 2: Japanese Laid-Open Publication No. 5-226635
Non-Patent Document 1: K. Shinohara, et al., Jpn. J. Appl. Phys. 41, L437 (2002)
Non-Patent Document 2: T. Enoki, et al., Int. J. High Speed Electron. Syst. 11, 137 (2001)
Non-Patent Document 3: M. J. W. Rodwell, et al., IEEE Trans. Electron Devices 48, 2606 (2001)

DISCLOSURE OF THE INVENTION

Problem that the Invention Intends to Solve

However, if design rules are reduced further and the gate length reaches 1 nm, transistors do not operate properly any more due to tunneling. It is thus said that with the current techniques, only transistors whose cutoff frequency is up to about 1 THz can be fabricated (see Non-Patent Documents 2 and 3, for example).

On the other hand, in optical communication systems, the transmission capacity is currently about 100 Gbits/second, but is expected to reach 1 Thits/second in the future. In that case, transistors will be required to have a cutoff frequency of 4 THz or higher. As described previously, however, with the current techniques, the upper limit is approximately 1 THz, and thus a new technique has to be developed.

The technique disclosed in Patent Document 1 uses the quantum Hall effect, and is a device that operates only at very low temperatures and hence cannot be used at normal room temperatures.

The present invention was made in view of the foregoing respects, and it is an object of the present invention to provide a current amplifying element that operates at a higher speed than the conventional semiconductor devices.

Means for Solving the Problem

In order to achieve the object, an inventive current amplifying element includes: an input current path which is formed between two input terminals and through which an input current flows; an output current path which is formed between two output terminals and through which an output current flows; and a magnetic generator. The input current path and the output current path are approximately perpendicular to each other; and a magnetic field generated from the magnetic generator is approximately perpendicular to both the input current path and the output current path. The input current path formed between the two input terminals means that the input current path is connected to each of the two spaced input terminals and forms a path through which the input current flows between those connection portions, and does not mean that the input current path is located in the space between the two input terminals in a strict sense. This holds true for the relation between the output terminals and the output current path. It is preferable that no insulator be interposed between the input terminals and the input current path so that the input terminals and the input current path make an ohmic contact. Likewise, it is desirable that no insulator be interposed between the output terminals and the output current path so that the output terminals and the output current path make an ohmic contact.

By this configuration, the magnetic field is applied in the direction perpendicular to the input current, whereby a potential gradient occurs in a direction at right angles to the input current due to the galvanomagnetic effects. Also, since there is no impedance in the input current path, the dependence of input impedance on frequency observed in the conventional transistors does not exist. Thus, the cutoff frequency is allowed to become very high. The magnetic generator herein means a substance which generates a magnetic field, and may be, for example, a magnet, or a wire through which a current flows.

The input current path and the output current path are preferably made of Si, a compound semiconductor, or a metal. The compound semiconductor may be SiC, SiGe, SiGeC, or a III-V compound semiconductor (such as GaAs, InGaAs, InSb, InAs, InP, GaN, or InGaN). The input current path and the output current path may be made of different materials.

In one preferred embodiment, an insulator is interposed between the input current path and the output current path.

In another preferred embodiment, the distance between the two input terminals is longer than the distance between the two output terminals.

The cutoff frequency is preferably 200 GHz or higher, and more preferably, 1 THz or higher.

An inventive current amplification method includes: a step of causing an input current to flow; a step of applying a magnetic field in a direction approximately perpendicular to a direction in which the input current flows; and a step in which an output current flows in a direction approximately perpendicular to the direction of the flow of the input current and the direction of the application of the magnetic field.

In one preferred embodiment, an area where the output current flows is separated from an area where the input current flows by an insulator.

Effects of the Invention

In the inventive current amplifying element, the input current path is located in a direction perpendicular to the magnetic field, the output current path is perpendicular to the input current path, and there is no factor that defines such a cutoff frequency's upper limit as is determined by the dependence of input impedance on frequency. Thus, the inventive current amplifying element is capable of operating at a very high speed.

EXPLANATION OF THE REFERENCE CHARACTERS

Figure 1A:
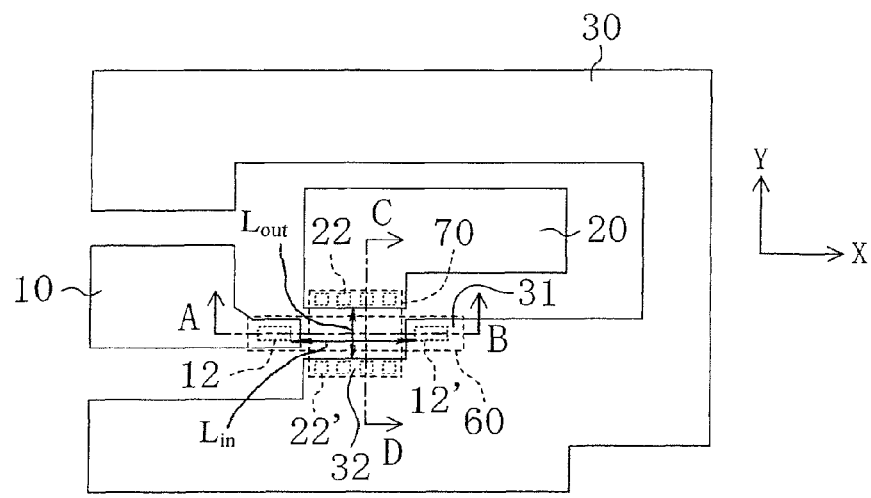
FIG. 1(a) is a schematic plan view of a current amplifying element according to a first embodiment.

12 Input terminal
15 Input terminal
22 Output terminal
25 Output terminal
33 Input terminal
35 Output terminal
40 Substrate
50 Insulating layer
51 Insulating layer
60 Input current path
62 Output current path
70 Output current path
80 Insulating film
90 Magnet

BEST MODE FOR CARRYING OUT THE INVENTION

Hereinafter, embodiments of the present invention will be described in detail with reference to the accompanying drawings. In the drawings, for the sake of simplicity, components having substantially the same functions are identified by the same reference numerals.

First Embodiment

Figure 1B:
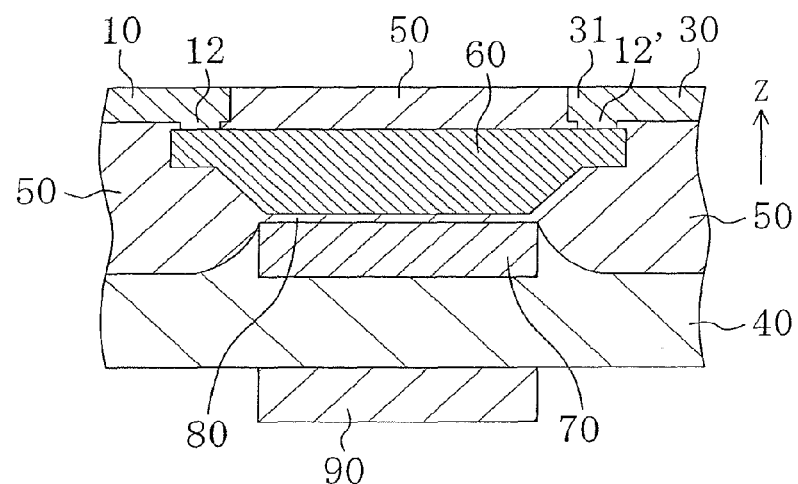
FIG. 1(b) is a cross-sectional view taken along the line A-B.
Figure 1C:
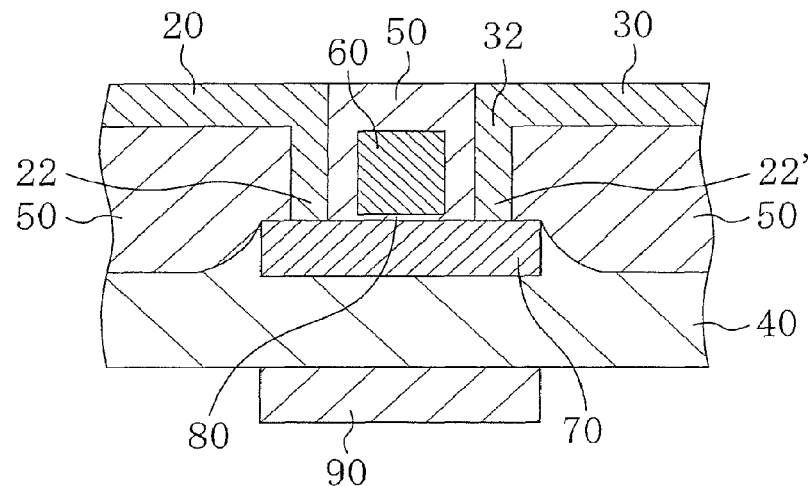
FIG. 1(c) is a cross-sectional view taken along the line C-D.

FIG. 1(a) is a schematic plan view of a current amplifying element according to a first embodiment, FIG. 1(b) is a schematic cross-sectional view taken along the line A-B in FIG. 1(a), and FIG. 1(c) is a schematic cross-sectional view taken along the line C-D in FIG. 1(a).

The current amplifying element of this embodiment is formed on a silicon substrate 40. In the cross-sectional views, i.e., in FIGS. 1(b) and 1(c), an input current path 60, which is made of polysilicon, is formed over an output current path 70, which is made of n$^+$-type Si by doping, with an SiO$_2$ insulator 80 interposed therebetween. A magnet 90 is bonded to the underside of the substrate 40. In the cross-sectional views, the magnet 90 has the north and south poles aligned in the vertical direction, and forms a magnetic field in the vertical direction (i.e., a direction Z) perpendicular to the output current path 70 and the input current path 60. The output current path 70 is a path (an area) where an output current flows, and the input current path 60 is a path (an area) where an input current flows.

On the other hand, the plan view, i.e., FIG. 1(a), shows that the input current path 60 and the output current path 70 are located in such a manner that the input current and the output current flow perpendicularly to each other. Specifically, in FIG. 1(a), the input current flows between two input terminals 12 and 12' (one input terminal 12' is a contact portion of an input ground terminal 31 which is a part of a ground wire 30). That is, the input current flows in the horizontal direction (i.e., a direction X) in FIG. 1(a). The output current flows between two output terminals 22 and 22' (one output terminal 22' is a contact portion of an output ground terminal 32 which is a part of the ground wire 30). That is, the output current flows in the vertical direction (i.e., a direction Y) in FIG. 1(a). As seen in FIG. 1(a), a distance $L_{in}$ between the two input terminals 12 and 12' is larger than a distance $L_{out}$ between the two output terminals 22 and 22'. There is no insulator interposed between the input terminals 12 and 12' and the input current path 60, and the input terminals 12 and 12' and the input current path 60 are thus in direct contact with each other to make an ohmic contact. The output terminals 22 and 22' and the output current path 70 are connected in the same manner. Over the substrate 40, insulating layers 50 are formed in regions other than the input current path 60, the output current path 70, the input terminals 12 and 12', the output terminals 22 and 22', and the terminal-to-terminal wires (i.e., an input wire 11, an output wire 20, and the ground wire 30).

The current amplifying element of this embodiment can be fabricated by using a known semiconductor device fabrication method. The magnet 90 may be bonded to the substrate's underside with an adhesive etc. after the input current path 60, the output current path 70, the input terminals 12 and 12', the output terminals 22 and 22', the terminal-to-terminal wires, and the insulating layers 50 are formed on or over the substrate 40. As the magnet 90, a JFE flat rolled magnetic steel sheet (a product of JFE Steel Corporation in which B=1.47 T and the thickness is 100 μm), for example, may be used.

Next, operation of the current amplifying element of this embodiment will be described.

First, an input voltage is applied between the input terminals 12 and 12' to cause an input current to flow through the input current path 60 in the direction X. When the input current flows in the direction X, a Hall electric field is generated in the direction Y by a galvanomagnetic effect because of the presence of the magnetic field in the direction Z. Furthermore, when the input voltage is applied in the direction X, this input voltage affects the output current path 70 through the insulator 80, and in addition, the magnetic field is present in the direction Z. Thus, due to a galvanomagnetic effect, a current flows through the output current path 70 in the direction Y. In this way, when an input current is caused to flow, a current directly flows through the output current path 70 because of the two galvanomagnetic effects, and the Hall electric field affects the output current path 70 in the direction Y so that a voltage is applied to make the output current flow in a larger amount, thereby amplifying the current. The galvanomagnetic effects mean various electrical thermal phenomena that a metal or a semiconductor exhibits when the metal or the semiconductor is placed in a magnetic field. The Hall effect is one of the galvanomagnetic effects.

Examples of semiconductor devices employing the galvanomagnetic effects include the field effect transistor disclosed in Patent Document 1, and a thin-film semiconductor device having memory function disclosed in Patent Document 2. The field effect transistor of Patent Document 1 differs in configuration from the present invention in that a magnetic field is perpendicularly applied to the source-drain current, but is applied in parallel to the gate current. In addition, the physical phenomenon used in the field effect transistor of Patent Document 1 is conduction in which energy dissipation due to optical phonons caused by the quantum Hall effect does not occur, and thus differs from the normal Hall effect employed in the present invention.

In the semiconductor device of Patent Document 2, a magnetic field is formed in a direction perpendicular to the direction in which source and drain electrodes are connected, and the Hall effect of the galvanomagnetic effects is used to sense a Hall voltage which is generated in a direction perpendicular to both the direction of the connection of the source and drain electrodes and the direction of the magnetic field when a current flows between the source and the drain. In this manner, the semiconductor device is used as a memory. The Hall effect is a phenomenon in which when a conductor through which a current is flowing is placed in a magnetic field perpendicular to the current, a potential gradient occurs in a direction at right angles to the current. The semiconductor device of Patent Document 2 is a memory which uses this Hall effect as it is defined.

However, the current amplifying element of this embodiment, in which the input current path 60 and the output current path 70 are separated by the insulator 80, does not use the Hall effect as it is, and the current amplifying element of this embodiment is a current amplifying element not a memory. The present inventors found that when a Hall electric field occurs in the input current path 60, the Hall electric field affects the output current path 70 as well through the insulator 80, and that the input voltage also affects the output current path 70 through the insulator 80, and thus they came up with this embodiment.

In this embodiment, a higher cutoff frequency is achieved by the galvanomagnetic effects as compared to the conventional current amplifying elements in which the cutoff frequency is determined by input impedance.

An example of this embodiment will be discussed below, and a description will be also made of theoretical aspects of the present invention.

EXAMPLE

The present inventors fabricated a current amplifying element having the same configuration as that shown in FIG. 1.

The length (i.e., the distance between the input terminals) of the input current path 60 was 50 μm, and the length (i.e., the distance between the output terminals) of the output current path 70 was 0.1 μm. The thickness of the insulator 80 was 3.7 nm. A neodymium magnet having a magnetic flux density of 0.5 T was used as the magnet 90.

High frequency characteristics were evaluated by measuring the S parameters of the current amplifying element and then calculating from the S parameters an H21 component of the H parameters to obtain a current gain. The current gain is obtained as the magnitude |H21| of the H21 component. The input and output DC biases applied when the S parameters were measured were both 2V.

Figure 3:
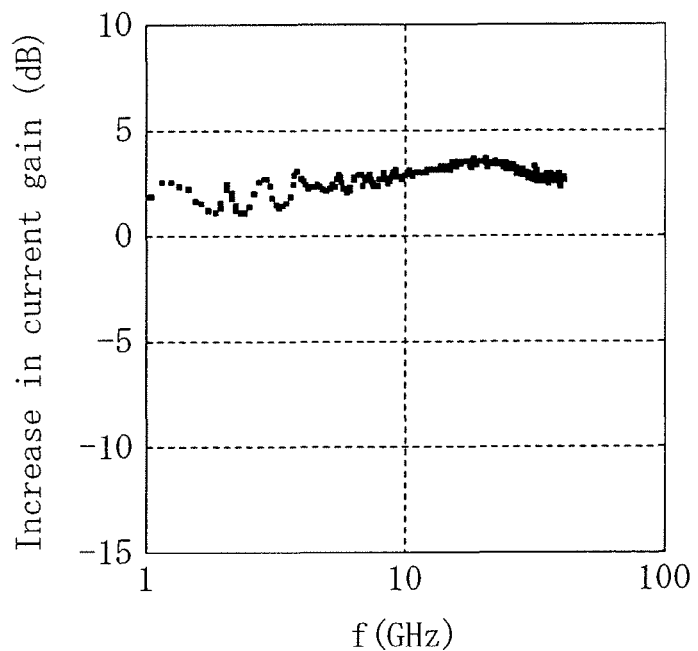
FIG. 3 shows the dependence of current gain increase on frequency in an example.

FIG. 3 shows the frequency characteristics of a current gain obtained by subtracting a current gain when no magnetic field was applied from a current gain when a magnetic field was applied, i.e., the frequency characteristics of a current gain increased by the application of the magnetic field. It is found that the current gain was increased by the application of the magnetic field as compared to when there was no magnetic field. In the following descriptions, the frequency at which the current gain increase is 0 (dB) is defined as the device's cutoff frequency, and this example will be discussed.

As shown in FIG. 3, in this example, since the measurements were made only up to 40 GHz, it is not possible to know the cutoff frequency at which the increase in current gain is 0. Therefore, assuming that at frequencies equal to or higher than 40 GHz, the current gain decreases in inverse proportion to the frequency, the cutoff frequency was estimated. This assumption is based on an equation that expresses the increase G in current gain in an ideal case. The increase G in current gain is given within the constant-relaxation-time approximation by the following equation, where the mobility of electrons in current paths is μ, the magnitude of magnetic flux density is B, the collision relaxation time of the electrons in the current paths is τ, the length of the input current path is L, the length of the output current path is W, and the input/output frequency is f.

$$G = \left|\frac{I_{out}}{I_{in}}\right| = \frac{\mu B}{\sqrt{1 + (2\pi f \tau)^2}} \cdot \frac{L}{W}$$

This equation is derived from the galvanomagnetic effects as follows. When an electric field $E=(E_x, E_y, E_z)$ and a magnetic field $B=(0, 0, B)$ in the direction Z are applied to a substance, the density $J=(J_x, J_y, J_z)$ of a current that flows through the substance due to the galvanomagnetic effects is given by the following equation.

$$\begin{bmatrix} J_x \\ J_y \\ J_z \end{bmatrix} = \frac{ne^2\tau}{m^*} \frac{1}{1+(\tau\omega_c)^2} \begin{bmatrix} 1 & -\tau\omega_c & 0 \\ \tau\omega_c & 1 & 0 \\ 0 & 0 & 1 \end{bmatrix} \cdot \begin{bmatrix} E_x \\ E_y \\ E_z \end{bmatrix}$$

In this equation, n is the concentration of carriers (electrons or holes) in the substance, −e is the elementary charge of the electrons, τ is the collision relaxation time of the carriers, m* is the effective mass of the carriers, and $\omega_c$ is the cyclotron angular frequency where $\omega_c=eB/m^*$.

Suppose a case in which the substance is provided with two input terminals in parallel with the x axis and two output terminals in parallel with the y axis. To suppose an ideal case, it is assumed that no electric field is present in the z direction. It is also assumed that an electric field applied is not an electrostatic field that does not vary with time, but an electric field that oscillates at an angular frequency of ω is applied. In this case, the current density J is approximately given by the following equation.

$$\begin{bmatrix} J_x \\ J_y \\ J_z \end{bmatrix} = \frac{ne^2\tau}{m^*} \frac{1}{(1+i\omega\tau)^2 + (\tau\omega_c)^2} \begin{bmatrix} 1+i\omega\tau & -\tau\omega_c & 0 \\ \tau\omega_c & 1+i\omega\tau & 0 \\ 0 & 0 & 1 \end{bmatrix} \cdot \begin{bmatrix} E_x \\ E_y \\ E_z \end{bmatrix}$$

When the input current path and the output current path have a thickness of d in the direction Z, the input current $I_x$ is approximately $J_x$Wd, the output current $I_y$ is $J_y$Ld, and the increase G in current gain is derived as $|I_y/I_x|$. Accordingly, the equation that expresses the increase G in current gain is derived from this equation.

When the frequency f is low, namely when $1 >> 2\pi\tau f$, an increase in G is a constant value irrespective of the frequency. On the other hand, when the frequency f is increased to $1 << 2\pi\tau f$, G is expected to decrease in inverse proportion to f. The assumption described above was made from the dependence of G on frequency in such an ideal case.

The cutoff frequency obtained according to this assumption may be underestimated and lower than the actual cutoff frequency. This is because data on the increase in current gain in the vicinity of 40 GHz shows that as the frequency increases, the current gain increase does decrease but not to such a degree that the decrease is inversely proportional to the frequency.

Figure 4:
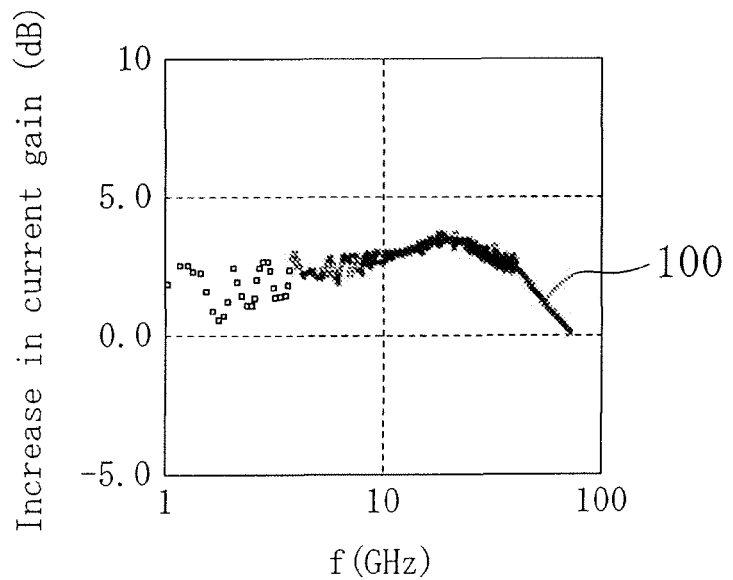
FIG. 4 is a view from which a cutoff frequency in the example is estimated.

In FIG. 4, a theoretical line 100 which indicates an increase in current gain that decreases in inverse proportion to the frequency is added to the data shown in FIG. 3. From FIG. 4, the cutoff frequency is estimated to be 71 GHz. As mentioned previously, the actual cutoff frequency is presumably higher than 71 GHz.

The frequency f when G=1 is the cutoff frequency. Therefore, as the electron mobility increases, the cutoff frequency also increases in proportion to the electron mobility. For example, in the current amplifying element in this example, if the length of the output current path 70 is halved to 0.05 μm (50 nm), G will be doubled and increased by about 6 dB. In this case, the cutoff frequency is estimated to be about 200 GHz. Considering the current semiconductor device fabrication techniques, it is sufficiently possible to perform 50-nm processing. Hence, it is possible to mass-produce current amplifying elements made of Si and having a cutoff frequency of 200 GHz.

Moreover, in this example, n$^+$-type Si is used for the output current path 70, and the electron mobility is as low as about 100 cm²/Vs because of the doping (the doping concentration is 1×10$^{19}$ cm$^{-3}$). Due presumably to this, the estimated cutoff frequency is about 71 GHz and is not so high. Therefore, a cutoff frequency when GaAs, which is a compound semiconductor having a higher electron mobility than Si, is used will be estimated below.

Figure 5:
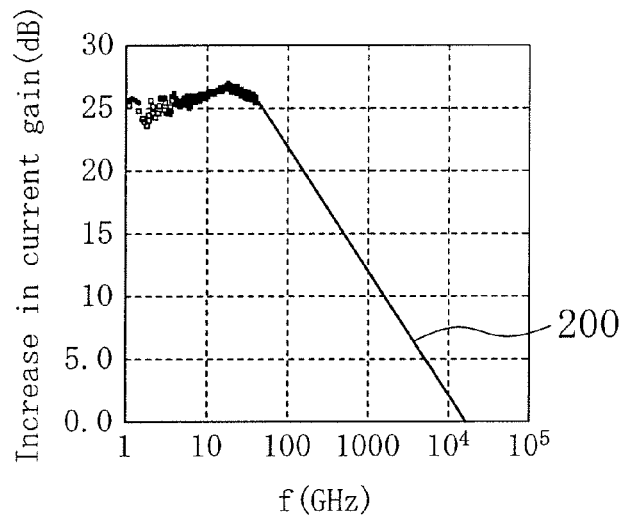
FIG. 5 is a view from which another cutoff frequency in the example is estimated.

In GaAs, when the doping concentration is 1×10$^{19}$ cm$^{-3}$, the electron mobility is expected to be about 1300 cm²/Vs. Thus, in this example, if the semiconductor material is changed from Si to GaAs, it is assumed from the above equation that G will be increased thirteen times, that is, G will be increased by about 22 dB. FIG. 5 shows the frequency characteristics of GaAs based on this assumption. As in the case of Si, an inverse-proportion theoretical line 200 is provided to estimate the cutoff frequency, which is found to be about 15 THz. This cutoff frequency greatly exceeds 1 THz, which has been considered to be the upper limit in the conventional semiconductor amplifying elements.

Figure 6:
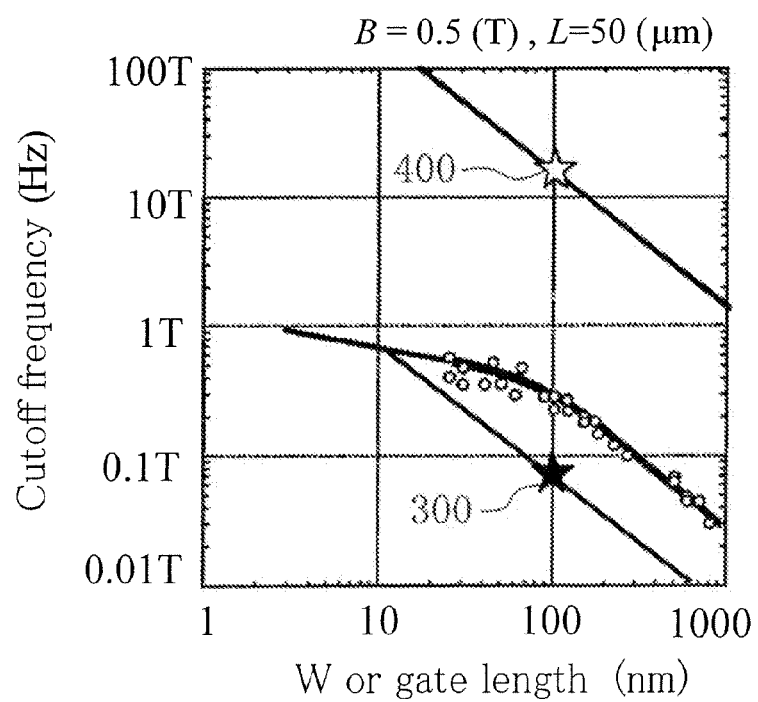
FIG. 6 is a view in which characteristics in the example and those of a conventional current amplifying element are compared.

FIG. 6 is characteristic graphs indicating a summary of the foregoing descriptions, in which the ordinate represents the cutoff frequency (THz) and the abscissa indicates the length W of the output current path or the gate length (nm). Of the three graphs, the middle one indicates the characteristics of a conventional (GaAs-based) current amplifying element which does not use the Hall effect. In the lower graph, in which the characteristics of a current amplifying element made of Si and using the Hall effect are calculated and indicated, the characteristics of this example (in which the output current path is 100 nm) are indicated by a point 300. In the upper graph, in which the characteristics of a current amplifying element made of GaAs and using the Hall effect are calculated and indicated, the characteristics obtained when the distance between the output terminals is 100 nm are indicated by a point 400. As can be seen, although being made of Si, the current amplifying element of this example has the characteristics (the cutoff frequency) close to those of the conventional current amplifying element made of GaAs, and if the current amplifying element of this example is made of GaAs, the cutoff frequency thereof will become almost two orders higher than that of the conventional current amplifying element. In order to obtain a current amplifying element having an even higher cutoff frequency, a modulation-doped structure etc. may also be used.

Second Embodiment

Figure 2A:
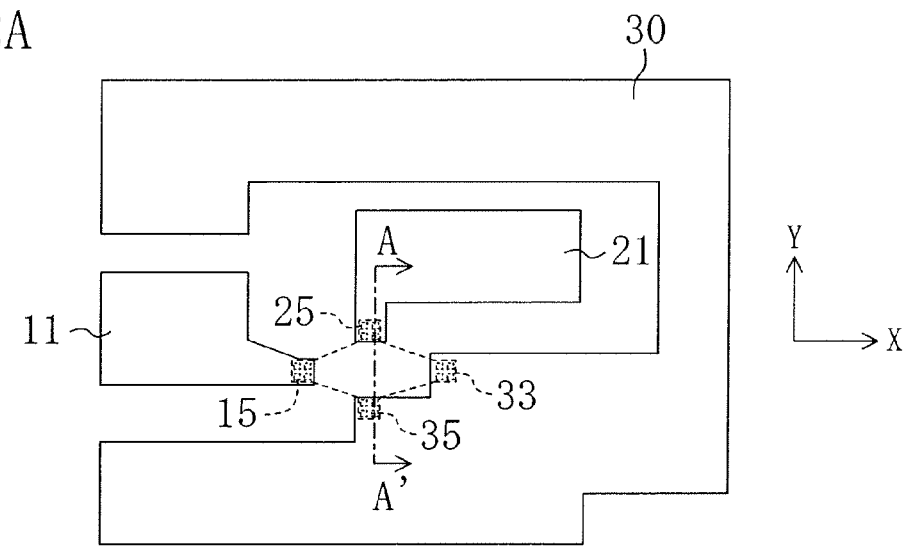
FIG. 2(a) is a schematic plan view of a current amplifying element according to a second embodiment.
Figure 2B:
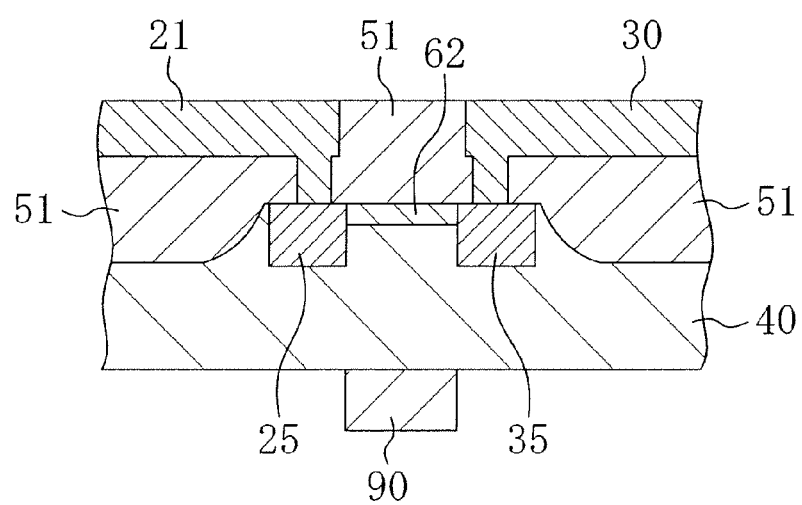
FIG. 2(b) is a cross-sectional view taken along the line A-A'.

FIG. 2(a) is a schematic plan view of a current amplifying element according to a second embodiment, and FIG. 2(b) is a schematic cross-sectional view taken along the line A-A' in FIG. 2(a).

The current amplifying element of this embodiment is formed on a silicon substrate 40, and an input current path and an output current path 62 are made of Si doped with an impurity. Unlike in the first embodiment, the input current path and the output current path 62 are not separated by an insulator, and parts of these current paths occupy the same part in the current amplifying element. Specifically, the input current path that connects two input terminals 15 and 33 (one of them is a part of a ground wire 30) and the output current path 62 that connects two output terminals 25 and 35 (one of them is a part of the ground wire 30) occupy the same area in the part shown in FIG. 2(b).

An input wire 11 made of Al is directly connected with the input current path at the input terminal 15 which is a contact portion. The other input terminal 33 is a contact portion in the ground wire 30. An output wire 21 made of Al is electrically connected with the output terminal 25 serving as a contact portion, and the output terminal 25 is directly connected with the output current path 62. The output terminal 35, which is another contact portion, is connected with the ground wire 30. The input current path and the output current path 62 are made of n-type Si. A magnet 90 is bonded to the underside of the substrate 40 made of p-type Si. In the cross-sectional view, the magnet 90 has the north and south poles aligned in the vertical direction, and forms a magnetic field in the vertical direction perpendicular to the output current path 62 and the input current path.

On the other hand, the plan view shows that the input current path and the output current path 62 are located in such a manner that an input current and an output current flow perpendicularly to each other. Specifically, in FIG. 2(a), the input current flows between the two input terminals 15 and 35 and thus flows in the horizontal direction in the figure, while the output current flows between the two output terminals 25 and 35 and thus flows in the vertical direction in the figure. Over the substrate 40, insulating layers 51 are formed in regions other than the input current path, the output current path 62, the input terminals 15 and 33, the output terminals 25 and 35, the input wire 11, the output wire 21, and the ground wire 30.

In this embodiment, the input terminals 15 and 33 and the output terminals 25 and 35 are located to form a rhombus in FIG. 2(*a*). To be more precise, if each side of the input terminals 15 and 33 and of the output terminals 25 and 35 is regarded as one side, the input terminals 15 and 33 and the output terminals 25 and 35 are located to form an octagon, and the sides that connect these terminals form a rhombus. By placing the terminals in these locations, it is possible to suppress the current flowing from the input terminal 15 through the output terminal 25 to the input terminal 33 located close to the ground.

In this embodiment, unlike in the first embodiment, the input current path and the output current path 62 are not separated by an insulator, however, the input current path and the output current path 62 are perpendicular to each other, and a magnetic field perpendicular to these current paths is formed. Therefore, theoretically, current amplification is performed by the galvanomagnetic effects.

Other Embodiments

It is to be understood that the foregoing embodiments are illustrative only of the present invention, and the present invention is in no way limited to those illustrative embodiments. For example, the material of which the input current path and the output current path are made is not limited to Si and GaAs, but may be SiC, SiGe, SiGeC, a III-V compound semiconductor, such as InGaAs, a metal, such as Cu, Au, or Al, etc. A material having a high electron mobility is particularly preferable.

The input current path and the output current path do not have to be perpendicular to each other in a strict sense, but may be off from the perpendicular direction by a few degrees and may be approximately perpendicular to each other. Furthermore, theoretically, if components that are not parallel but perpendicular to each other are present, current amplification is performed. Likewise, it will be sufficient if the magnetic field generated by the magnetic generator is approximately perpendicular to both the input current path and the output current path, that is, if there is at least a component perpendicular to both the input current path and the output current path, the effect of current amplification will be produced.

In the first embodiment, the thickness of the insulator 80 is preferably small. Specifically, it is desirable that the thickness of the insulator 80 be from 0.5 nm to 100 nm. The insulator 80 may be any film, such as an $SiO_2$ film, an SiN film, or a silicon oxynitride film.

In the current amplifying elements according to the present invention, since the cutoff frequency increases as the electron mobility increases, it is desirable that a semiconductor heterojunction be formed so that the output current path has a HEMT structure. As the semiconductor hetero-junction, a known junction may be employed.

The magnetic generator may be a permanent magnet, an electromagnet, or a wire through which a current flows so long as the input current is placed in the magnetic field. Also, the magnetic generator does not need to be disposed on the substrate, but may be disposed in the vicinity of the substrate so that the input current is placed in the magnetic field when the current amplifying element operates. Furthermore, as can be seen from the equation of the current gain increase G, it is preferable that the magnetic field generated from the magnetic generator be large. In the present invention, unlike in the invention disclosed in Patent Document 1, the magnet (the magnetic generator) for providing a magnetic field to multiple current amplifying elements may be a single magnet, and therefore, a large strong magnet is preferably disposed above or below an integrated circuit. Considering miniaturization of the entire device, a magnetic thin film is preferably placed on the underside or topside of the substrate to generate a magnetic field. In that case, the magnetic thin film may be formed on the underside or topside of the substrate 40 by sputtering or the like. Alternatively, the magnetic generator may be disposed between the input current path and the output current path.

From the equation of the current gain increase G, considering parameters other than the parameters already mentioned, it is preferable for a higher cutoff frequency that the length L of the input current path be long and the electron collision relaxation time τ be small. If the length L is considered together with the length W of the output current path, the cutoff frequency will practically be increased to a sufficient degree when L/W is 1 or higher. Furthermore, if L/W is increased to 50 or higher, the cutoff frequency will be increased further, which is more preferable.

Moreover, the current amplifying elements described so far are preferably formed on the same substrate as other elements having other functions such as rectification, oscillation, and memory.

INDUSTRIAL APPLICABILITY

As described above, the current amplifying elements according to the present invention have a very high cutoff frequency, and thus are applicable to amplifying elements in optical communication systems, in high frequency analog radio systems, etc.

The invention claimed is:
1. A current amplifying element comprising:
an input current path which is formed between two input terminals and through which an input current flows;
an output current path which is formed between two output terminals and through which an output current flows, the output current path being approximately perpendicular to the input current path; and
a magnetic generator that generates a magnetic field that is approximately perpendicular to both the input current path and the output current path,
wherein the interaction between a current flowing through the input current path and the magnetic field generates a Hall electric field that amplifies an output current flowing through the output current path, and
wherein an insulator is interposed between the input current path and the output current path.
2. The current amplifying element of claim 1, wherein a distance between the two input terminals is longer than a distance between the two output terminals.
3. A current amplification method comprising:
applying an input voltage across an input current path to cause an input current to flow along a first direction;
applying a magnetic field in a direction approximately perpendicular to the direction in which the input current flows;

wherein the interaction between current flowing through the input current path and the magnetic field generates a Hall electric field that amplifies an output current flowing through an output current path in a direction approximately perpendicular to the direction of the flow of the input current and the direction of the application of the magnetic field, wherein an area where the output current flows is separated from an area where the input current flows by an insulator.

* * * * *